LOGIC GATES CIRCUIT HAVING COMPLEMENTARY OUTPUT DRIVE

Filed April 18, 1966 2 Sheets-Sheet 1

NOR GATE

INVENTOR
GEORGE W. NIEMANN
E. Mickey Hubbard
ATTORNEY

LOGIC GATES CIRCUIT HAVING COMPLEMENTARY OUTPUT DRIVE

Filed April 18, 1966 2 Sheets-Sheet 2

INVENTOR
GEORGE W. NIEMANN

E. Mickey Hubbard
ATTORNEY 3,506,846

LOGIC GATE CIRCUIT HAVING COMPLEMENTARY OUTPUT DRIVE

George W. Niemann, Dallas, Tex., assignor to Texas Instruments Incorporated, Dallas, Tex., a corporation of Delaware Filed Apr. 18, 1966, Ser. No. 552,358
Int. Cl. H03k 19/34
U.S. Cl. 307—215 14 Claims

ABSTRACT OF THE DISCLOSURE

Disclosed is a logic gate circuit that provides relatively increased switching speeds and repetition rates and relatively shorter propogation delays. This novel circuit includes a pair of complementary output transistors having common collectors that forms the output of the circuit and emitters that are respectively connected to a voltage supply. Logic input means are coupled to the base of one of the output transistors for driving one of the transistors, and switching means are coupled to the base of the other transistor for driving the other transistor, and circuit means are provided for controlling the switching means so that the output transistors are alternatively conductive in response to the logic applied to the input means.

The invention described herein was made in the performance of work under a NASA contract and is subject to the provisions of Section 305 of the National Aeronautics and Space Act of 1958, Public Law 85–568 (72 Stat. 435; 42 USC 2457).

This invention relates generally to logic circuits, and more particularly relates to low power logic gates with faster switching speeds, increased repetition rates, and shorter propagation delays.

Speed is one of the principal features of merit in a logic circuit. The term "speed" usually implies the speed at which the output changes from one state to another, i.e., the slope of the transition of the output, the delay in propagating a changed logic level through the circuit, and the rate at which the circuit can be cycled between the states, i.e., the repetition rate. As a general principle, the speed of operation of any particular logic circuit configuration can be increased by increasing the power applied to the circuit. In many applications, such as in airborne and space systems, power must be supplied by batteries or solar cells and is therefore at a premium. Even in systems where power is readily available, it is generally desirable to reduce the power required in order to reduce the amount of heat dissipated, and thus permit greater component density and thus greater overall system speed. Accordingly, considerable effort has been devoted toward the development of micropower logic circuits.

Logic circuits may be classified generally by the components used to effect the gating at the input and the logic levels at the output. The more conventional circuits use a single transistor amplifier stage for the output and either diodes, resistors or transistors for performing the logic function and driving the output transistor. The general approach to decreasing the power requirements of these circuits has been to increase the resistance in the collector circuit of the output transistor. These gate circuits, as well as other forms of single ended logic, all suffer from degraded rise times as the collector resistor is increased in order to limit the power required. In addition, power is still dissipated in the collector resistance when the output transistor is turned on.

Gate circuits using transistors for the input function have certain advantages. However, when the circuits are modified so as to achieve lower power, a low noise margin results. Further, the reverse gain of the gating transistor causes current sinking problems and makes the gate inoperable under higher fan-out loads. Another disadvantage is that the output logic level does not follow the collector supply voltage level, and modifications to make this possible have produced increased power requirements.

Another type of transistor logic utilizes a complementary pair of output transistors together with resistors and diodes for the logic input. While this type of circuit has some advantages, all configurations heretofore proposed have required three different power supply voltages in order to obtain reasonable performance. Also, the complementary output transistor that is turned on, must be turned on through a high impedance, thus resulting in storage time problems. Further, the three supply voltages must track within relatively close tolerances in order to insure proper operation.

It is generally accepted as axiomatic in the art that a decrease in power results in a decrease in speed of operation, and the consensus is that this is caused by the RC time constants resulting from the active device capacitance and the passive resistance of the circuit, which is indeed large in most conventional approaches.

An important object of this invention is to provide an improved low power logic circuit.

Another object is to provide a low power logic circuit having faster switching speeds, increased repetition rates, and shorter propagation delays.

Still another object is to provide such a logic circuit having a relatively high noise margin.

Another object of the invention is to provide a gate circuit having a complementary output drive that requires only one voltage supply.

Still another object is to provide a circuit in which the output logic level follows the voltage supply.

A further object is to provide such a logic circuit which may be operated over a wide range of supply voltage levels.

Another very important object of the invention is to provide a logic circuit which can be fabricated in integrated circuit form.

Another object is to provide such a logic circuit having relatively short storage times and relatively short RC time constants.

A further object is to provide a logic circuit capable of driving a large number of other similar logic circuits.

Still another object is to provide such a circuit which has a low impedance output for both logic levels, thereby providing improved noise immunity.

These and other objects and advantages are provided by a gate circuit having a complementary pair of output transistors the collectors of which are common and form the output of the gate circuit. The emitters of the output transistors are connectable to separate voltage supplies. The base of one of the output transistors is driven by a logic input transistor and the base of the other transistor is driven by a switching transistor, preferably in both cases, through both D.C. and A.C. coupling. The logic input transistor and the switching transistor are operated in the alternative in accordance with logic levels applied to the input transistor means.

The novel features believed characteristic of this invention are pointed out with particularity in the appended claims. The invention itself, however, as well as other objects and advantages thereof, may best be understood by reference to the following detailed description of illustrative embodiments, when read in conjunction with the accompanying drawings, wherein:

Figure 1:
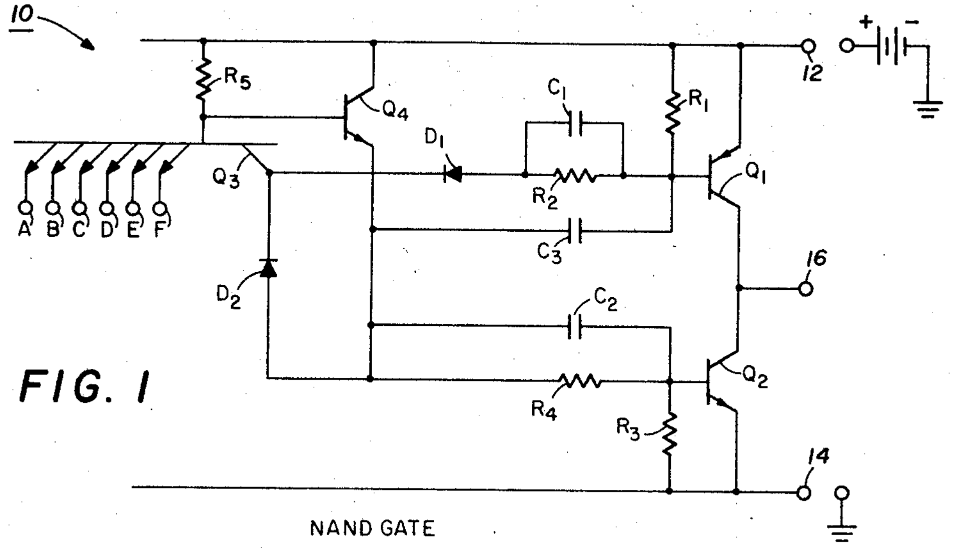
FIGURE 1 is a schematic circuit diagram of a NAND gate constructed in accordance with the present invention.

Referring now to the drawings, and in particular to FIGURE 1, a NAND gate constructed in accordance with the present invention is indicated generally by the reference numeral 10. The NAND gate 10 is comprised of a complementary pair of output transistors $Q_1$ and $Q_2$. The collectors of transistors $Q_1$ and $Q_2$ are common and form the output terminal 16 of the gate circuit. The emitters of transistors $Q_1$ and $Q_2$ are connected to a positive voltage supply terminal 12 and a ground terminal 14.

An input transistor $Q_3$ has multiple emitters A–F which are the logic inputs for the circuit. A logic "0" level is nominally ground potential and a logic "1" level is nominally the supply voltage at terminal 12. The same logic levels apply to the output terminal 16.

The base of transistor $Q_1$ is D.C. biased by the voltage divider network comprised of resistors $R_1$ and $R_2$ and diode $D_1$ that is connected between terminal 12 and the collector of transistor $Q_3$. The base of transistor $Q_2$ is D.C. biased by the voltage divider comprised of resistors $R_3$ and $R_4$ which are connected between the ground terminal 14 and the voltage supply terminal 12 by the collector-emitter circuit of a switching transistor $Q_4$. The bases of transistors $Q_3$ and $Q_4$ are common and are driven from the voltage supply terminal 12 through resistor $R_5$.

A capacitor $C_1$ is connected in shunt around the resistor $R_2$ to A.C. couple the base of transistor $Q_1$ and the collector of transistor $Q_3$, and a capacitor $C_2$ is connected in shunt around the resistor $R_4$ to A.C. couple the base of transistor $Q_2$ and the emitter of transistor $Q_4$. Capacitor $C_3$ A.C. couples the emitter of transistor $Q_4$ and the base of transistor $Q_1$. Diode $D_2$ interconnects the base of transistor $Q_2$ and the collector of transistor $Q_3$ through resistor $R_4$.

In the operation of the gate circuit 10, assume first that at least one of the emitter inputs A–F is at a logic "0" level, i.e., is nominally a ground potential, the base-emitter junction of transistor $Q_3$ is then forward biased and base current flows from the voltage supply terminal 12 through resistor $R_5$ to transistor $Q_3$, and transistor $Q_3$ is turned on. As a result, the emitter-base junction of transistor $Q_1$ is forward biased, and transistor $Q_1$ is turned on. Transistor $Q_4$ is in the low transconductance state as a result of the low voltage at the common bases of transistors $Q_3$ and $Q_4$. Transistor $Q_2$ is turned off as a result of transistor $Q_3$ being turned on and transistor $Q_4$ being in the low conductance state. Thus, the output 16 will be essentially at the supply voltage applied to terminal 12 because transistor $Q_1$ is turned on and transistor $Q_2$ is turned off.

Assume now that all of the emitter inputs A–F are raised to the logic "1" level corresponding nominally to the supply voltage at terminal 12. Then all gating emitters A–F are reverse biased and transistor $Q_3$ is turned off. As transistor $Q_3$ is turned off, the potential of the base of transistor $Q_4$ rises rapidly so that the conductance of transistor $Q_4$ is rapidly increased. As transistor $Q_4$ becomes more conductive, the high current pulse is coupled through the low impedance path provided by capacitor $C_2$ to drive the base of transistor $Q_2$ and rapidly turn transistor $Q_2$ on.

At the same time, the abrupt change in current through transistor $Q_4$ is coupled through the low impedance path provided by capacitor $C_3$ and rapidly turns transistor $Q_1$ off. Output 16 is then essentially connected to the ground terminal 14 and is therefore at a logic "0" level. Transistor $Q_2$ is maintained on by current supplied through transistor $Q_4$, and transistor $Q_1$ is maintained off due to the fact that transistor $Q_3$ is off. Diode $D_1$ shifts the voltage level to an extent sufficient to insure that the base of transistor $Q_1$ remains at a sufficiently high potential.

As any one of the inputs A-F again returns to a logic "0," transistor $Q_3$ is again turned on and the conductance of transistor $Q_4$ is reduced. As transistor $Q_3$ turns on, base current is supplied for transistor $Q_1$ through the low impedance path formed by diode $D_1$ and capacitor $C_1$ and transistor $Q_1$ is rapidly turned on. As the conductance of transistor $Q_4$ is decreased, capacitor $C_3$ couples the positive transition to the base of transistor $Q_1$, thereby assisting in turning transistor $Q_1$ off. As the conductance of transistor $Q_4$ increases, base current is supplied to transistor $Q_2$ through the low impedance path provided by capacitor $C_2$ to the base of transistor $Q_2$ which rapidly turns transistor $Q_2$ on. It will be noted that the current gain of transistor $Q_4$ reduces the effective value of the capacitor $C_2$ so that the speed with which transistor $Q_2$ is turned on is delayed only by the RC time constant associated with resistor $R_5$ and the capacitance of $C_2$ referred to the base of transistor $Q_4$.

It will be noted from the preceding description that drive current is supplied to the base of both transistors $Q_1$ and $Q_2$ through an active device, i.e., transistors $Q_3$ and $Q_4$, for both logic states so that the circuit has a symmetrical drive. Further, low impedance paths are provided during transition from either state to the other by the capacitors $C_1$, $C_3$ and $C_2$. In each instance, the current gain of the respective transistors $Q_3$ and $Q_4$ reduces the value of the capacitor used for A.C. coupling by a factor equal to the current gain of the respective transistor, thus decreasing the RC time constants involved in switching. For the worst case condition, base current for transistor $Q_2$ must be supplied through resistor $R_5$ to the base of transistor $Q_4$, which in turn drives the base of transistor $Q_2$ through capacitor $C_2$. As heretofore mentioned, the current gain of transistor $Q_4$ decreases the effective value of capacitor $C_2$, thus decreasing the RC time constant. In the case of transistor $Q_1$, base current is provided through the circuit extending from terminal 12 through the emitter-base of transistor $Q_1$, capacitor $C_1$, diode $D_1$ and the collector-emitter circuit of transistor $Q_3$. Thus, the RC time constant is the saturation resistance of transistor $Q_3$ and the value of capacitor $C_1$. Switching speed is also enhanced by reason of the fact that transistor $Q_4$ is continually operated in the active region, rather than in the reverse biased and saturated regions normally associated with on-off switching. Thus, it will be noted that long storage times and long resistor-capacitor time constants are decreased through the use of transistor $Q_4$ in combination with transistor $Q_3$ and the capacitors $C_2$ and $C_3$.

The noise margin is increased through the divide down action provided by resistors $R_1$ and $R_2$, and the action of resistors $R_3$ and $R_4$. The complementary output transistors $Q_1$ and $Q_2$ provide a low impedance drive in both the logic "1" and logic "0" output states and thus provide ideal noise immunity. Yet only a single voltage supply is required, which permits operation over a relatively wide range of voltage supplies, typically from 2.5 to 6.0 volts. The critical problems produced by the inverse current gain of the output transistors $Q_1$ and $Q_2$ as a result of voltage level shifts and current sinking are eliminated by the resistor $R_4$ and by driving the output from the voltage source through transistor $Q_1$. In fact, the inverse current gain of the transistors is not detrimental to circuit operation, the only effect being a slight increase in power due to inverse emitter-to-emitter current. The complementary output drive allows the logic level of the output to follow the supply voltage.

Figure 2:
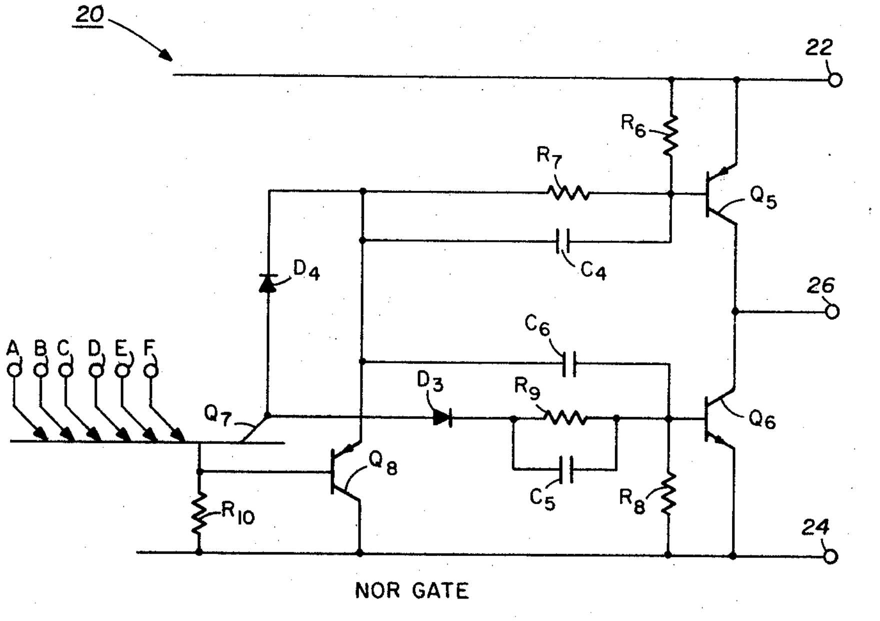
FIGURE 2 is a schematic circuit diagram of a NOR gate constructed in accordance with the present invention.

A NOR gate constructed in accordance with the present invention is indicated generally by the reference numeral 20 in FIGURE 2. The similarity between the NOR gate 20 and the NAND gate 10 will be evident to those skilled in the art, the two gates being the same except that the multiple emitter input logic transistor and the switching transistors are PNP devices in the NOR gate, rather than PNP devices as in the NAND gate, and the associated circuitry is inverted to accommodate the change.

The NOR gate 20 is comprised of a complementary pair of output transistors $Q_5$ and $Q_6$ which are connected between a positive voltage supply terminal 22 and a ground terminal 24. The collectors of the output transistors $Q_5$ and $Q_6$ are common and form the output terminal 26. The base of transistor $Q_5$ is biased by a voltage divider comprised of resistors $R_6$ and $R_7$ and is driven by current through switching transistor $Q_8$. The base of transistor $Q_6$ is biased by a voltage divider comprised of resistors $R_8$ and $R_9$ and current is supplied through a multiple emitter logic input transistor $Q_7$ having logic inputs A–F. Diode $D_3$ is a voltage shifting device. The bases of transistors $Q_7$ and $Q_8$ are biased by resistor $R_{10}$ which connects the respective bases to the ground terminal 24. Diode $D_4$ connects the collector of transistor $Q_7$ to the base of transistor $Q_5$ through resistor $R_7$. A capacitor $C_4$ A.C. couples the emitter of transistor $Q_8$ to the base of transistor $Q_5$, and capacitor $C_6$ A.C. couples the emitter of transistor $Q_8$ to the base of transistor $Q_6$. Capacitor $C_5$ A.C. couples the base of transistor $Q_6$ to the collector of transistor $Q_7$.

The operation of the NOR gate 20 is substantially the same as the operation of the NAND gate 10 except for the logic function performed. Thus, if any one of the logic inputs A–F is at a logic "1" level, i.e., at the voltage level of the supply voltage terminal 22, then transistor $Q_7$ is conductive to supply base current to transistor $Q_6$ and turn transistor $Q_6$ on. Switching transistor $Q_8$ is in a low conductance state which in combination with transistor $Q_7$ being on turns transistor $Q_5$ off. The output 26 is then connected essentially to the ground terminal 24 and is at a logic "0" level. If all of the inputs A–F are at a logic "0" then transistor $Q_7$ is turned off and transistor $Q_8$ is in a high conductance state. Transistor $Q_8$ then supplies a drive current for the base of transistor $Q_5$, thereby turning transistor $Q_5$ on. Since transistor $Q_7$ is turned off, transistor $Q_6$ is turned off, thus connecting the output terminal 26 to the voltage supply terminal 22 to provide a logic "1" level.

During switching, transistor $Q_5$ is rapidly turned on by base current supplied through transistor $Q_8$ and the low impedance path provided by capacitor $C_4$. The pulse coupled through capacitor $C_6$ assists in turning transistor $Q_6$ off. Conversely, transistor $Q_6$ is rapidly turned on as transistor $Q_7$ turns on because of the low impedance path formed by capacitor $C_5$. This is assisted by the pulse coupled through capacitor $C_6$ as transistor $Q_8$ changes to the low conductance state. Transistor $Q_5$ is rapidly turned off as transistor $Q_8$ reverts to the low conductance state by the low impedance coupling provided by capacitor $C_4$. Thus it will be noted that the NOR gate 20 operates in substantially the same manner as the NAND gate 10.

Figure 3:
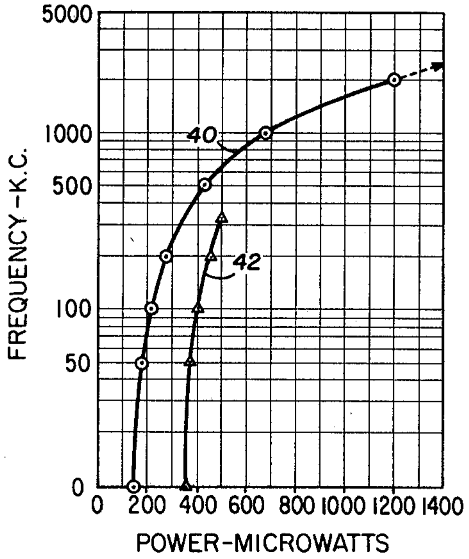
FIGURE 3 is a plot of frequency with respect to power for comparing a typical logic circuit constructed in accordance with the present invention with typical prior art logic circuits of the same general class.

Referring now to FIGURE 3, the frequency at one embodiment of the NAND gate 10 can be operated at 25° C. for a given power input as represented by the curve 40. Under no load conditions, standby power was 156 microwatts using a voltage supply of 2.7 volts. The maximum frequency was 5 megacycles at 2170 microwatts. On the other hand, curve 42 represents the frequency with respect to power of a conventional NAND gate using a complementary pair of output transistors driven by resistor-diode input logic means. Under no load conditions, the standby power of such a circuit was 333 microwatts and the maximum frequency was 330 kilocycles at 496 microwatts of power. Such a circuit required three separate voltage supplies of 4.05 volts, 2.7 volts and −1.35 volts. It is important to note the difference in curves 40 and 42. The circuit of this invention requires only about one-half the power of the prior art circuit for a given frequency, or conversely provides approximately twice the frequency for a given power level. But more important, the upper frequency limit of the prior art device is limited by the circuit figuration, while a circuit in accordance with this invention is essentially limited only by the capacitance of the active components. Therefore, as the technology for fabricating active devices improves, the RC time constants involved in the circuit of this invention will further decrease and the frequency or speed of the gate circuit will increase.

Figure 4:
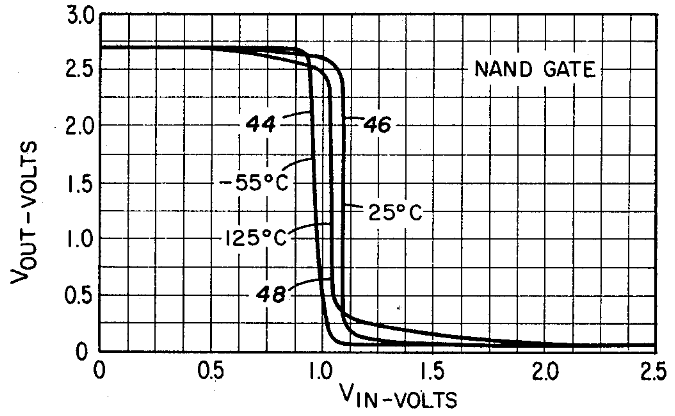
FIGURE 4 is a plot of the input voltage with respect to the output voltage at various temperatures for a typical embodiment of the NAND gate illustrated in FIGURE 1.
Figure 5:
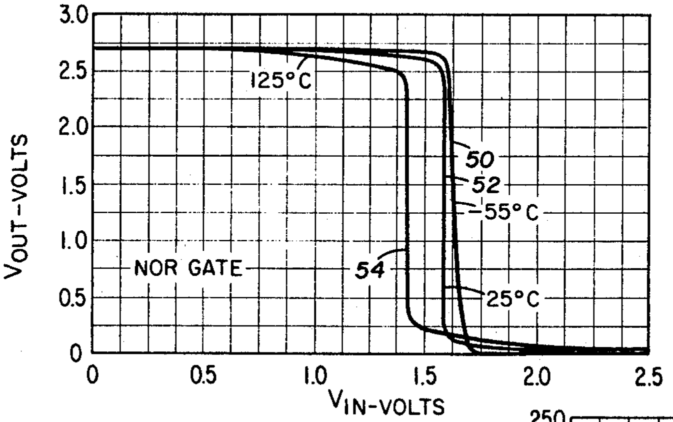
FIGURE 5 is a plot of the input voltage with respect to the output voltage at various temperatures for a typical embodiment of the NOR gate illustrated in FIGURE 2.

The curves 44, 46 and 48 represent the output voltage at terminal 16 of the NAND gate 10 with respect to the voltage at the inputs A–F at −55° C., 25° C. and 125° C., respectively. It will be noted from FIGURE 4 that the NAND gate 10 has approximately a 1.0 volt noise margin over a wide temperature range. Curves 50, 52 and 54 in FIGURE 5 represent the voltage at output 26 of NOR gate 20 with respect to the voltage at the inputs A–F at −55° C., 25° C. and 125° C., respectively. Thus, it will be noted that the NOR gate 20 has approximately a 1.5 volt noise margin over a wide temperature range. In both cases, the supply voltage was about 2.7 volts.

Figure 6:
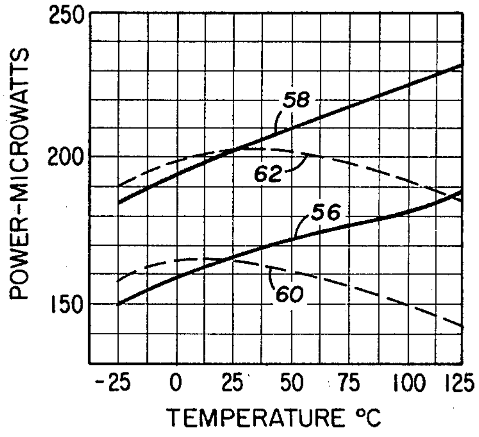
FIGURE 6 is a plot of the power with respect to temperature comparing the power dissipation of a NAND gate fabricated using nominal resistors and a NAND gate fabricated using diffused resistors.

An important advantage of the gate circuits 10 and 20 is that the circuits require only a single voltage supply. Another important advantage is that the gate circuits are particularly suited for fabrication as integrated circuits on single monolithic substrates by diffusion techniques. An operational advantage resulting from fabrication of the resistors of the circuit by diffusion is illustrated in FIGURE 6. The solid curves 56 and 58 represent the power required at a given temperature to operate a gate circuit having nominal resistors at 10 and 50 kilocycles, respectively. The dotted curves 60 and 62 represent the power required at the corresponding temperatures to operate a similar device at corresponding frequencies using diffused resistors. Thus, it will be noted that the power decreases markedly with an increase in temperature when using diffused resistors. This is due to the fact that as the temperature of the diffused resistors increases, the resistance increases to offset the $V_{BE}$ decrease, as opposed to the resistance of a nominal resistor decreasing or remaining constant with temperature.

Both the NAND and NOR gates 10 and 20 have been fabricated in integrated circuit form using diffusion techniques. The single supply voltage is typically 2.7 volts, but may range from 2.5 to 6.0 volts with a maximum of 7.4 volts without damage. Power drain is typically 250 microwatts. Rise time is typically 70 to 200 nanoseconds for the NAND gate and 300 to 400 nanoseconds for the NOR gate. Fall time is typically 70 to 200 nanoseconds for the NAND gate and 50 to 100 nanoseconds for the NOR gate. Propagation delays are typically 200 to 300 nanoseconds for both types of gates. Fan-out is five, fan-in is six. The maximum frequency is typically 500 kHz. to 700 kHz. for both gates.

Although preferred embodiments of the invention have been described in detail, it is to be understood that various changes, substitutions and alterations can be made therein without departing from the spirit and scope of the invention as defined by the appended claims.

What is claimed is:

1. In a logic gate circuit, the combination of (a) a pair of complementary output transistors having common collectors forming the output of said gate circuit and emitters respectively connected to a voltage supply;

(b) logic input means both A.C. and D.C. coupled to the base of each of said output transistors, said input means drive the base of one of said output transistors;

(c) switching means A.C. coupled to the base of said one transistor and both A.C. and D.C. coupled to the base of the other output transistor, said switching means drive the base of the other of said output transistors; and (d) circuit means for controlling said switching means so that said output transistors are alternatively conductive in response to predetermined logic input signals applied to said input means.

2. In a logic gate circuit, the combination of:

a complementary pair of output transistors the collectors of which are common and form the output of the gate circuit and the emitters of which are connected to voltage supply terminals, logic input transistor means coupled to the base of one of the output transistors for driving the base of the output transistor through the collector-emitter circuit of the input transistor means, an emitter-follower transistor coupled to the base of the other transistor for driving the base of the transistor, and circuit means for alternatively controlling the logic input transistor means and the emitter-follower transistor.

3. The combination defined in claim 2 wherein the emitter-follower transistor is A.C. and D.C. coupled to the base of said other transistor.

4. The combination defined in claim 2 wherein the logic input transistor means comprises a multiple emitter transistor the collector of which is connected to the base of the driven transistor and the emitters of which are the logic inputs, and wherein the circuit means comprises means interconnecting the base of the multiple emitter transistor and the base of the emitter-follower transistor, and means for connecting the bases through a resistance to a voltage supply whereby when the multiple emitter transistor is turned on by the application of a voltage level to an emitter thereof, the emitter-follower transistor will be turned off, and when the multiple emitter transistor is turned off by the application of another voltage level to all of the emitters, the emitter-follower transistor will be turned on.

5. In a logic gate circuit, the combination of:

a complementary pair of output transistors the collectors of which are common and form the output of the gate circuit and the emitters of which are connected to voltage supply terminals, a multiple emitter logic input transistor means, circuit means D.C. coupling the collector of the input transistor means to the base of each of the output transistors such that when the input transistor means is conductive, one of the output transistors will be conductive and the other nonconductive, and when the input transistor means is nonconductive, said other output transistor will be conductive and said one output transistor will be nonconductive, switching transistor means the base of which is common with the base of the input transistor means, circuit means for biasing the common bases of the input transistor means and switching transistor means, and circuit means D.C. and A.C. coupling the emitter of the switching transistor means to the base of said other output transistor whereby said switching transistor will drive the base of said other output transistor.

6. The combination defined in claim 5 further characterized by circuit means A.C. coupling the collector of the input transistor means and the base of said one output transistor.

7. The combination defined in claim 5 further characterized by circuit means A.C. coupling the emitter of the switching transistor and the base of said one output transistor.

8. In a logic gate circuit, the combination of:

first and second output transistors of complementary type the collectors of which are common and form the output of the gate circuit, first circuit means connecting the emitter of the first transistor to a first power supply terminal, second circuit means connecting the emitter of the second output transistor to a second power supply terminal, logic input transistor means, third circuit means D.C. coupling the base of the first output transistor and the collector of the input transistor means, fourth circuit means D.C. coupling the base of the second output transistor and the collector of the input transistor means, fifth circuit means including a resistance interconnecting the first power supply terminal and the base of the first output transistor, sixth circuit means including a resistance interconnecting the base of the second output transistor and the second power supply terminal, seventh circuit means including a resistance interconnecting the base of the input transistor means and the first power supply terminal, switching transistor means the base of which is connected to the base of the input transistor means, eighth circuit means connecting the collector of the switching transistor to the first power supply terminal, and ninth circuit means coupling the emitter of the switching transistor means to the base of the second output transistor, whereby the input transistor means will drive the base of the first output transistor and the switching transistor means will drive the base of the second output transistor.

9. The combination defined in claim 8 wherein the ninth circuit means includes circuit means A.C. coupling the emitter of the switching transistor means through a low impedance path.

10. The combination defined in claim 8 wherein the third circuit means includes means for A.C. coupling the base of the first output transistor and the collector of the input transistor means.

11. The combination defined in claim 8 wherein the third circuit means includes rectifying means oriented in opposed relationship to the collector-base junction of the input transistor means for establishing a voltage level at the base of the first output transistor sufficient to maintain the first output transistor off when the input transistor means is off.

12. The combination defined in claim 8 wherein the fourth circuit means includes rectifying means oriented in opposition to the collector-base junction of the input transistor means to prevent base current to the second output transistor from passing through the base-collector circuit of the input transistor means.

13. The combination defined in claim 8 further characterized by tenth circuit means for A.C. coupling the emitter of the switching transistor to the base of the first output transistor.

14. In a logic gate circuit, the combination of:

a pair of complementary output transistors having common collectors forming the output of said gate circuit and emitters respectively connected to a voltage supply;

logic input means coupled to the base of at least one of said output transistors for driving said one transistor base through a first circuit;

switching means coupled to the base of the other of said output transistors for driving said other transistor base through a second circuit; and circuit means for controlling said switching means so that said output transistors are alternatively conductive in response to the logic applied to said input means.

References Cited

UNITED STATES PATENTS

| | | | |
|---|---|---|---|
| 3,140,405 | 7/1964 | Kolling | 307—208 |
| 3,155,963 | 11/1964 | Boensel | 307—255 X |
| 3,171,984 | 3/1965 | Eshelman et al. | 307—215 |
| 3,229,119 | 1/1966 | Bohn et al. | 307—215 X |
| 3,287,577 | 11/1966 | Hung et al. | 307—215 |
| 3,319,175 | 5/1967 | Dryden | 307—313 X |

DONALD D. FORRER, Primary Examiner

U.S. Cl. X.R.

307—214, 218, 313